United States Patent
Kim et al.

(10) Patent No.: US 8,365,034 B2
(45) Date of Patent: Jan. 29, 2013

(54) FORWARD ERROR CORRECTION (FEC) ENCODING AND DECODING METHOD OF VARIABLE LENGTH PACKET BASED ON THREE-DIMENSIONAL STORAGE APPARATUS

(75) Inventors: Hyun-Cheol Kim, Daejeon (KR); Han Kyu Lee, Daejeon (KR); Jin Woo Hong, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 320 days.

(21) Appl. No.: 12/878,595

(22) Filed: Sep. 9, 2010

(65) Prior Publication Data

US 2011/0154161 A1 Jun. 23, 2011

(30) Foreign Application Priority Data

Dec. 18, 2009 (KR) ........................ 10-2009-0127230

(51) Int. Cl.
*H03M 13/00* (2006.01)
*H04L 1/18* (2006.01)
(52) U.S. Cl. ...................................... 714/751
(58) Field of Classification Search .................. 714/746, 714/751–752, 755, 758, 800–801
See application file for complete search history.

(56) References Cited

U.S. PATENT DOCUMENTS 7,134,069 B1* 11/2006 Longwell et al. ............. 714/800
7,827,461 B1* 11/2010 Low et al. ..................... 714/752

FOREIGN PATENT DOCUMENTS

KR 10-0458878 11/2004

OTHER PUBLICATIONS

Leo, Selavo, Dynamic Data encoding for page oriented memories, 2004, University of Pittsburg, p. 1 to 123, retrieved from google.com on Sep. 18, 2012.*

* cited by examiner

*Primary Examiner* — Shelly A Chase
(74) *Attorney, Agent, or Firm* — Nelson Mullins Riley & Scarborough LLP; EuiHoon Lee, Esq.

(57) ABSTRACT

Provided is a Forward Error Correction (FEC) encoding method of a variable-length packet using a three-dimensional (3D) storage apparatus. In the FEC encoding method, an FEC coding may be performed to calculate a corresponding parity packet while an input data packet is imaginarily connected to the 3D storage apparatus having a predetermined storage width and data area height to be arranged, the calculated parity packet may be stored and arranged in a vertical direction and a depth direction of the 3D storage apparatus, and an expansion data packet including both information for restoration of a data packet and the data packet may be transmitted together with the parity packet.

20 Claims, 10 Drawing Sheets

RESTORATION IMPOSSIBLE
AREA BASED ON 2D FEC

FORWARD ERROR CORRECTION (FEC) ENCODING AND DECODING METHOD OF VARIABLE LENGTH PACKET BASED ON THREE-DIMENSIONAL STORAGE APPARATUS

CROSS-REFERENCE TO RELATED APPLICATION

This application claims the benefit of Korean Patent Application No. 10-2009-0127230, filed on Dec. 18, 2009, in the Korean Intellectual Property Office, the disclosure of which is incorporated herein by reference.

BACKGROUND

1. Field of the Invention

Embodiments of the present invention relate to a Forward Error Correction (FEC) encoding/decoding method of a variable length-packet using a three-dimensional (3D) storage apparatus, and more particularly, to a transmission/reception method of a variable length packet based on an FEC coding scheme that may generate a parity packet for a variable-length packet without performing a padding to enable a restoration of a dropped packet, and to enable a transmission unit to quickly transmitting a data packet.

2. Description of the Related Art

A digital communication system may use an Automatic Repeat Request (ARQ) scheme or a Forward Error Correction (FEC) scheme as a method of enabling a transmission unit to control noise or errors generated in a channel while transmitting data.

The ARQ scheme may be performed by analyzing whether an error exists in a received data block and by requesting a re-transmission of a block having the error, and may not be suitable for a system where many errors occur while requesting a reduction in a delay.

The FEC scheme may enable a reception unit to detect and restore an error without performing a re-transmission even though the error occurs, by further transmitting side data when transmitting data through a channel. As examples of the FEC scheme, a Hamming scheme, a Bose, Chaudhuri, and Hocquengham (BCH) scheme, a Reed Solomon (RS) code scheme, and the like may be given. The RS code scheme may enable detection and correction of an error in a byte unit.

In "an RTP Payload Format for Generic Forward Error Correction" (Internet Engineering Task Force (IETF) Request For Comment Document (RFC) 2733, December 1999) suggested by J. Rosenberg et al., and adopted as an IETE standard, an exclusive logical sum (XOR) may be used. In the exclusive-OR, a single parity packet may be transmitted to a set of a single packet through a separate stream. When the single packet is dropped in a corresponding set, a reception unit may restore the dropped packet. To have compatibility with a host where the FEC scheme is not implemented, the parity packet may have a unique Real Time Processing (RTP) payload type value. A host that is not aware of the RTP payload type value may advance a further process while discarding the received parity packet. To discard a packet having the payload type value which the host is not aware of may be based on "RTP: a Transport Protocol for Real-Time Applications" (IETF RFC 1889, January 1996) of H. Schulzrine, that is, a previous IETF document.

Also, in "an Improved UDP Protocol for Video Transmission Over Internet-to Wireless Networks" (IEEE Tr. On Multimedia, pp 356-365, September 2001) of H. Zheng et al., and "an Adaptive Redundancy Control Method for Erasure-Code Based Real-Time Data Transmission Over the Internet" (IEEE Tr. On Multimedia, pp 366-374, September 2001) of S.-W. Yuk et al., a shortened RS code may be used for restoration of an erased packet. Here, the erasure may denote a loss or an error occurring in a predetermined position.

When a data packet 'k' is transmitted together with '(n−k)' parity packets, a reception apparatus may restore a dropped packet even though up to a maximum of '(n−k)' packets are dropped.

A serial number of the dropped packets may be counted by the reception apparatus by using an RTP protocol. The counting method of the serial number may restore at least one packet and thus, may be relatively effective compared to the RFC 2733

A method of restoring the at least one packet has been suggested by Wagner et al. (draft-ietf-avt-uxp-02.txt: an RTP payload format for erasure-resilient transmission of progressive multimedia streams," March 2002), and has been standardized in the IETF.

The above described methods may be applied based on an assumption that a packet length is fixed. A packet length of a compressed audio may be fixed, whereas a packet length of a compressed video may be variable as illustrated FIG. 1.

FIG. 1 is a diagram illustrating a video where a packet length is variable between about 150 bytes and about 3000 bytes and an audio where a packet length is fixed as 112 bytes, in a related art.

Similar to moving picture services currently provided over the Internet, when a packet length to be transmitted is variable and does not allow a significant amount of delay, an improvement suitable for a stream where a packet length is variable while using the FEC scheme may be required.

FIG. 2 is a diagram illustrating a process where a variable-length packet is arranged based on a conventional FEC coding scheme.

In a current FEC coding scheme, since a parity packet is not generated with respect to the variable-length packet when the variable-length packet is transmitted, a padding process for generating packets having the same length, as illustrated in FIG. 2 may need to be performed. In this instance, a length of the parity packet may need to be matched with a packet having the greatest length within a related packet group, so that a waste of a bandwidth may be prevented. Also, a reception unit may not transmit an input packet until all of a packet '1' to a packet '6', that is, a related packet group, is inputted in order to verify a packet having the greatest length, which results in occurrence of delay.

To overcome this problem, an FEC scheme using a two-dimensional (2D) storage apparatus of FIG. 3 may be suggested.

FIG. 3 is a diagram illustrating a restoration process of a received packet in a variable-length packet reception method based on an FEC coding scheme using a conventional 2D storage apparatus.

However, in this case, a probability where a part where a restoration fails to be performed using the FEC scheme among related packet groups due to consecutively generated Internet characteristics when a packet loss occurs is generated may be relatively high.

SUMMARY

An aspect of the present invention provides a Forward Error Correction (FEC) encoding method of a variable length-packet using a three-dimensional (3D) storage apparatus, which may generate a parity packet of a vertical direction and a parity packet of a depth direction in the 3D storage apparatus, with respect to a variable-length packet imaginarily connected to the 3D storage apparatus, without performing a padding process, and a data packet may be immediately transmitted even though all related packet groups for generating the parity packet are not inputted, thereby minimizing a transmission delay.

Another aspect of the present invention provides an FEC decoding method, which may restore, in a 3D storage apparatus, at least one packet loss within related packet groups using a parity packet of a vertical direction and a parity packet of a depth direction with respect to a variable-length packet imaginarily connected to the 3D storage apparatus, without performing a padding process.

According to an aspect of the present invention, there is provided a Forward Error Correction (FEC) encoding method of a variable length-packet using a three-dimensional (3D) storage apparatus, the FEC encoding method including: receiving an input data packet to be transmitted when the input data packet exists; connecting the input data packet with the 3D storage apparatus and arranging the connected data packet to enable a storage width of the 3D storage apparatus to be a storage length, and to enable a data area height of the 3D storage apparatus to be a storage height; and calculating each of parity packets applied in a vertical direction or a depth direction with respect to the arranged data packet by performing an FEC encoding.

The FEC encoding method may further include storing and arranging the calculated parity packet in the vertical direction and the depth direction of the 3D storage apparatus, transmitting an expansion data packet including both information for restoration of the data packet and the data packet, and also transmitting both an expansion parity packet including the information for restoration of the data packet and the parity packet.

According to an aspect of the present invention, there is provided an FEC decoding method of a variable length-packet using a 3D storage apparatus, the FEC decoding method including: separating a data packet and a parity packet from a received expansion packet when the expansion packet exists; arranging, in the 3D storage apparatus, the separated data packet depending on an offset of the data packet to enable a storage width of the 3D storage apparatus to be a storage length, and to enable a data area height of the 3D storage apparatus to be a storage height; and performing an FEC decoding for the data packet using the parity packet applied in a vertical direction or a depth direction with respect to the arranged data packet to thereby restore the data packet, and transmitting the restored data packet to an upper layer.

Additional aspects, features, and/or advantages of the invention will be set forth in part in the description which follows and, in part, will be apparent from the description, or may be learned by practice of the invention.

EFFECT

According to an embodiment, variable-length data packets may be imaginarily connected with a three-dimensional (3D) storage apparatus, and stored every time each of the variable-length data packets are inputted in the 3D storage apparatus, and at the same time a parity packet may be updated with respect to a related packet group to enable the data packet to be immediately transmitted, thereby minimizing a delay occurring in a transmission unit.

Also, according to an embodiment, an FEC scheme may be repeatedly performed, in a vertical direction and a depth direction, with respect to a packet dropped while transmitting data, so that a superior quality of services may be provided, and a high quality of video services may be provided over the Internet.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
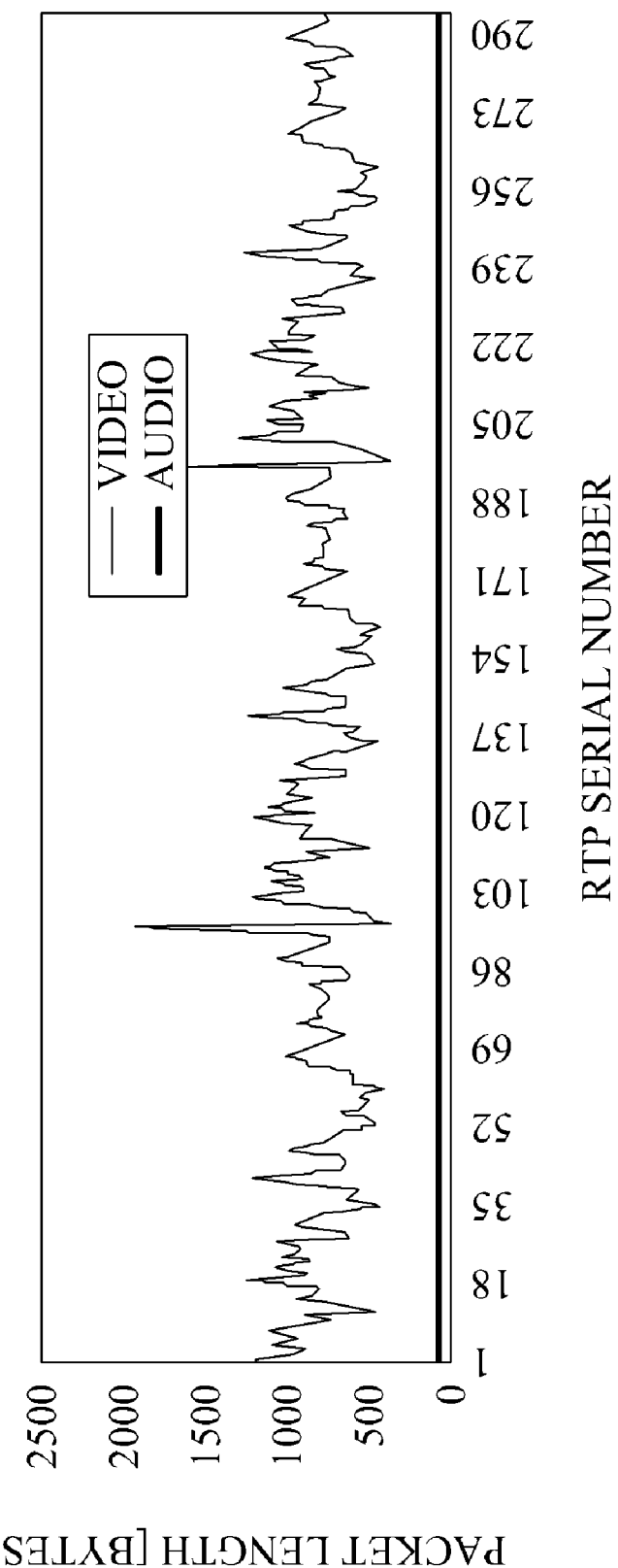
FIG. 1 is a diagram illustrating a video where a packet length is variable between about 150 bytes and about 3000 bytes and an audio where a packet length is fixed as 112 bytes, in a related art.
Figure 2:
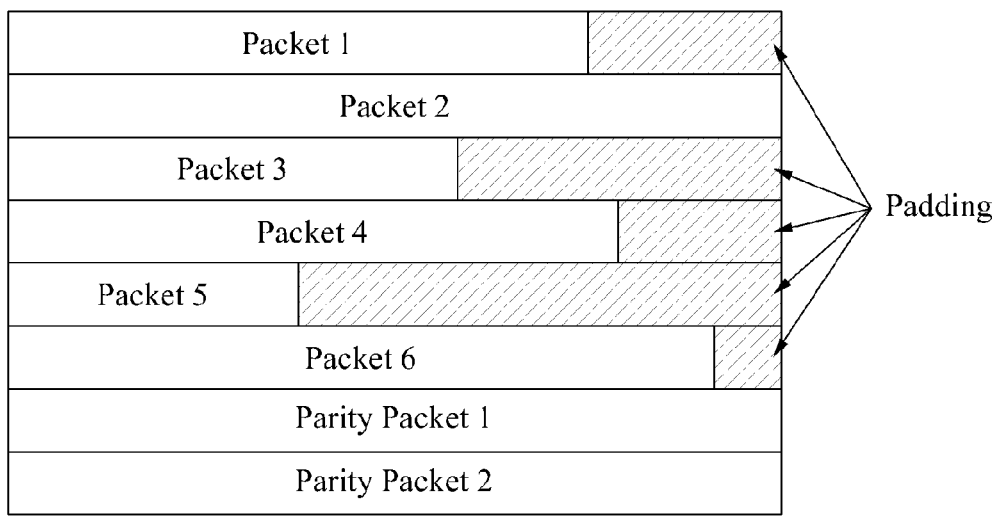
FIG. 2 is a diagram illustrating a process where a variable-length packet is arranged based on a conventional FEC coding scheme.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 4:
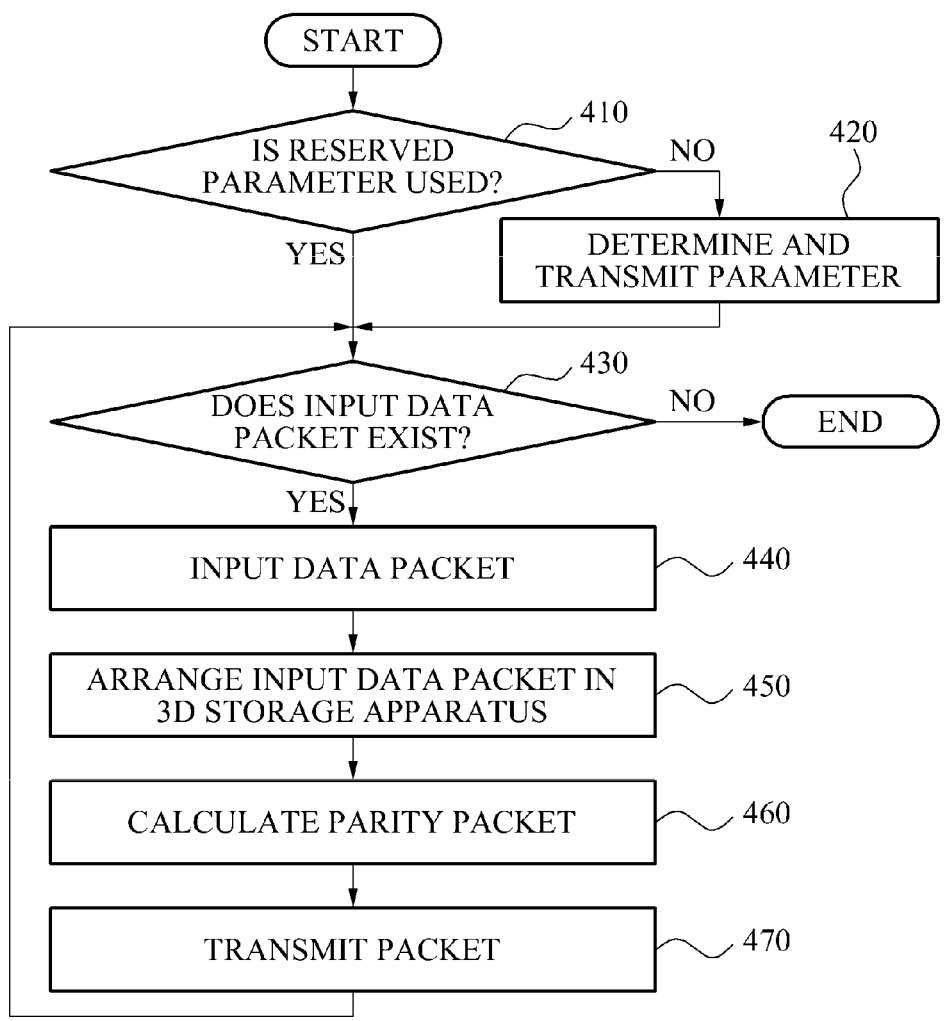
FIG. 4 is a flowchart illustrating a Forward Error Correction (FEC) encoding method of a variable length-packet using a three-dimensional (3D) storage apparatus according to an embodiment.

FIG. 4 is a flowchart illustrating a Forward Error Correction (FEC) encoding method of a variable length-packet using a three-dimensional (3D) storage apparatus according to an embodiment.

Referring to FIG. 4, the FEC encoding method may be performed in a transmission unit.

In operation 410, the transmission unit may determine whether a reserved value is used as a parameter required for FEC encoding and decoding.

In operation 420, when the reserved parameter is not used, the transmission unit may determine the parameter for the FEC encoding and decoding, and transmit the determined parameter to a reception unit.

When the reserved parameter is used, operation 420 of determining the parameter and transmitting the determined parameter to the reception unit may be omitted.

Here, the parameter required for the FEC encoding and decoding may be a storage width of the 3D storage apparatus where a packet to be transmitted is stored, a data area height, a number of parity packets of a vertical direction, and a number of parity packets of a depth direction.

In operation 430, the transmission unit may determine whether an input data packet, that is, a data packet to be transmitted exists.

In operation 440, when the input data packet exists, the transmission unit may receive the data packet.

In operation 450, the transmission unit may imaginarily connect the input data packet with the 3D storage apparatus where a storage width is L and a data area height is k1, and may arrange the input data packets in order.

In operation 460, the transmission unit may perform an FEC encoding in a vertical direction and a depth direction with respect to the arranged input data packets to thereby calculate a parity packet.

In operation 470, the transmission unit may transmit, to a reception unit, an expansion data packet both including information for restoration of the data packet and the data packet, and transmit the calculated parity packet.

In operations 460 and 470, the transmission unit may transmit, to the reception unit, the data packet and the parity packet after repeatedly calculating a corresponding parity packet every time a single data packet is inputted. Accordingly, while the input data packet exists, operations 440 to 470 may be repeatedly performed. When the input data packet does not exist, a transmission process may be terminated.

In operation 450, the imaginary connecting between the input data packet and the 3D storage apparatus may denote that packets to be stored are connected with the 3D storage apparatus to be stored, while a stored length is a storage width (L) of the 3D storage apparatus and a stored height is a data area height (k1) of the 3D storage apparatus.

In this instance, the storage width (L) and the data area height (k1) may be variable, and may be reported to the reception unit. The fixed storage width (L) and the height (k1) may be used while a call is performed. Alternatively, the width (L) and the height (k1) may be adaptively changed depending on a channel state and a packet length while the call is performed, and the changed width (L) and height (k1) may be transmitted to the reception unit.

In a case where the input data packet is imaginarily connected with the 3D storage apparatus to be arranged, when the input data packet is smaller than the storage width (L) of the 3D storage apparatus, the input data packet is arranged as is, when the input data packet is greater than the storage width (L), the input data packet may be arranged in advance by the storage width (L), and remaining input data packet may be arranged in a next line.

Also, in the case where the input data packet is imaginarily connected with the 3D storage apparatus to be arranged, when the input data packet is greater than the height (k1) of the 3D storage apparatus, the input data packet may be arranged in advance by the height (k1), and the remaining input data packet may be arranged in a next frame of a depth direction.

A process where the input data packets are connected with the 3D storage apparatus to be arranged, depending on the storage width (L) and storage height (k1) of the 3D storage apparatus may be repeatedly performed every time each of the data packet is inputted.

Hereinafter, FIG. 4 will be described with reference to FIG. 9.

Figure 9:
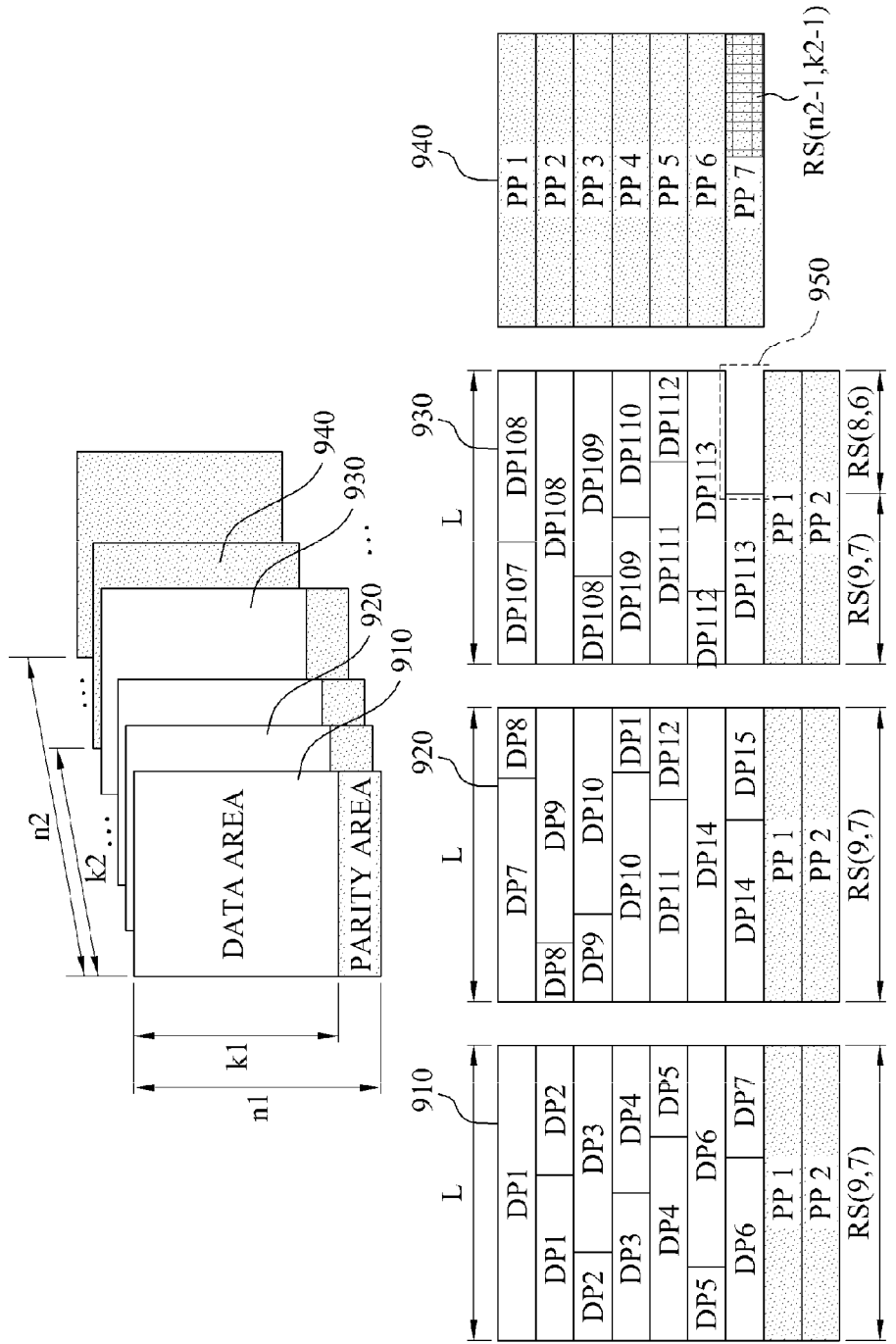
FIG. 9 is a diagram illustrating a process where packets are arranged in an FEC decoding method of a variable-length packet using a 3D storage apparatus according to an embodiment.

FIG. 9 is a diagram illustrating a process where packets are arranged in an FEC decoding method of a variable-length packet using a 3D storage apparatus according to an embodiment.

Referring to FIG. 9, since a size of an input data packet 1 (DP1) is greater than the storage width (L) of the 3D storage apparatus, only a part of the packet 1 (DP1) corresponding to the width (L) of the 3D storage apparatus may be previously arranged in a data area 910, and the remaining parts of the packet 1 (DP1) may be arranged in a next line. Also, a size of a data packet 2 (DP2) is smaller than the width (L) of the 3D storage apparatus, however, the remaining parts of the previously arranged packet 1 (DP1) may be arranged, a part of the data packet 2 (DP2) may be arranged of where, and the remaining part of the data packet (DP2) may be arranged in a next line. In a data packet 3 (DP3) and a data packet 4 (DP4) may be arranged in the same manner as that in the data packet 2 (DP2). Since the data packet 7 is connected to a data packet 6 (DP6) to be disposed when the data packet 7 (DP7) is inputted, however, exceeds the data area height (k1) of the 3D storage apparatus, only up to a part corresponding to the data area height may be disposed in advance, and the remaining parts may be arranged in a data area of a next frame 920.

In addition, an FEC algorithm may calculate parity information in a vertical direction of a storage length direction. Specifically, the FEC algorithm may calculate parity information of a digit 'n1−k1' in a vertical direction, and calculate parity information of a digit 'n2−k2' in a depth direction. In this case, various FEC algorithms may be used, however, a shortened Reed Solomon (RS) coding based on an GF 28 may be typically used. Since two pieces of digit parity information are calculated with respect to a first vertical column of the 3D storage apparatus of FIG. 9, with respect to a second vertical column, with respect to another vertical column, and finally with respect to a final L-th vertical column corresponding to the storage width (L) of the 3D storage apparatus, each of finally generated two parity packets (PP1 and PP2) may have the same packet length as the storage width (L) of the 3D storage apparatus.

Also, the transmission unit may apply an FEC algorithm in a depth direction with respect to data packets having the same vertical and horizontal positions in the data area of the 3D storage apparatus, thereby generating 'n2−k2' number of parity frames. That is, the transmission unit may perform the FEC coding in the depth direction with respect to the data packets arranged in a position (0, 0) to thereby calculate the 'n2−k2' number of parity information, and also perform the FEC coding in the depth direction with respect to data packets arranged in a position (0, 1) to thereby calculate the parity information. In this manner, when the above described FEC coding may be repeatedly performed, the 'n2−k2' number of parity information may be calculated, and the 'n2−k2' number of parity information corresponds to RS (n2, k2), which leads to a generation of 'n2−k2' number of parity frames 940. A final part 950 of the data area 930 may not be filled with information, and parity information of the depth direction corresponding to a position of the final part 950 may be generated as RS (n2−1, k2−1). A part where the parity information of the depth direction is generated as RS (n2, k2) may denote a part being restored even though a data packet of a 'n2−k2' byte among n2 bytes is dropped, and a part where the parity information of the depth direction is generated as RS (n2−1, k2−1) may denote a part being restored even though a data packet of a 'n2−k2' byte among 'n2−1' bytes is dropped.

A position within the 3D storage apparatus of each data packet, that is, an offset may need to be informed to the reception unit, and in order to report to the reception unit about the offset, a reserved field within a Real-time Transport Protocol (RTP) packet header or an available extension field defined by a user may be used.

Figure 5:
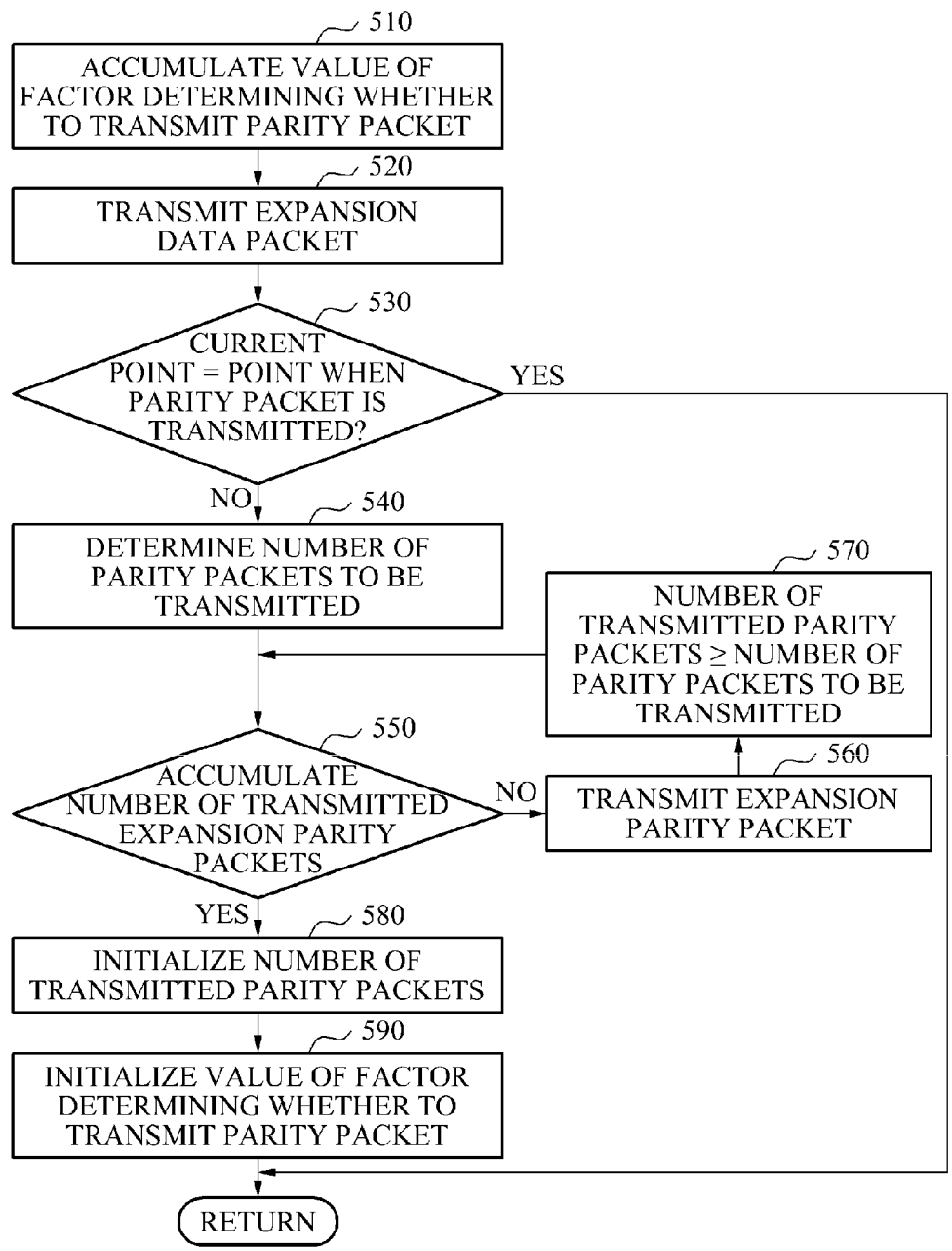
FIG. 5 is a flowchart illustrating an operation of transmitting a packet, illustrated in FIG. 4.

FIG. 5 is a flowchart illustrating an operation of transmitting a packet, illustrated in FIG. 4.

Referring to FIG. 5, when operation 460 of calculating the parity packet is performed after the data packet is inputted in operation 440 of FIG. 4, a value of a factor determining whether the parity packet is transmitted may be accumulated in operation 510. The factor may be one of a size of an input data packet, a number of inputted data packets, and time information.

In operation 520, an expansion data packet including information about restoration of a data packet and the data packet may be transmitted to the reception unit. Here, the information about the restoration of the data packet may be included in a header of the expansion data packet.

Also, the information about the restoration of the data packet may include a type and offset of the data packet in a case of the data packet, and include, in a case of the parity packet, a type and offset of the data packet, or include an entire size of the data packet within a related packet group, and an offset of each of the data packets.

When a protocol such as the RTP widely used in a real-time transmission is used, the offset may be expressed in the extension field to be transported, and the RTP packet itself may be the extension packet.

In operation 530, whether a current point in time is a point in time when the parity packet is transmitted may be determined.

The determining of whether to be the point in time when parity packet is transmitted may be changed depending on the factor determining the related packet group. In a case where the factor determining the related packet group is a threshold of the related packet group, when an accumulated value of sizes of the inputted data packets is greater than or equal to the threshold, the current point in time may be determined as the point in time when the parity packet is transmitted. Also, in a case where the factor is a number of thresholds of the input data packet, when a number of input data packets is the number of thresholds, the current point in time may be determined as the point in time when the parity packet is transmitted. Also, in a case where the factor is equal to a threshold amount of time, when an accumulated elapsed time of the packet group is greater than or equal to the threshold amount of time, the current point in time may be determined as the point in time when the parity packet is transmitted. In addition, since whether the current point in time is the point in time when the parity packet is transmitted may be determined using other various factors, the present invention is not limited to the above described factors.

When the current point in time is not determined as the point in time when the parity packet is transmitted, a corresponding process may return to operation 430 of determining whether the data packet is inputted.

In operation 540, when the current point in time is determined as the point in time when the parity packet is transmitted, a number of parity packets to be transmitted may be determined based on a channel state. Specifically, when the channel state is suitable, the number of the parity packets may be reduced to be transmitted, and when the channel state is poor, the number of the parity packets may be increased to be transmitted, thereby providing more superior image quality. Information regarding the channel state may be transmitted/received using a well-known technology such as Real-time Transport Control Protocol (RTCP).

In operation 550, the transmission unit may compare the number of the transmitted parity packets with the number of the parity packets to be transmitted determined in operation 540. In operation 560, when the number of the transmitted parity packets is included smaller than the number of the parity packets to be transmitted, the transmission unit may transmit the expansion parity packet including both the information about restoration of the packet and the parity packet. In operation 570, the transmission unit may accumulate the number of the transmitted parity packets. In this instance, the expansion parity packet may include an offset of a packet, that is, a position of the packet in the 3D storage apparatus, a type of the packet, and the parity packet. Also, the expansion parity packet may further include an offset of each of the data packets, and the offset of each of the data packets may be used for restoring a data packet without having a code indicating a boundary between packets.

In operation 580, when the number of the transmitted parity packets is greater than or equal to the number of the parity packets to be transmitted, the transmission unit may initialize the number of the transmitted parity packets and the number of the parity packets to be transmitted. In operation 590, the transmission unit may initialize a value of a factor determining whether to transmit the parity packet, and then may return to operation 430 of FIG. 4 determining whether the input data packet exists.

As described above, the consecutively inputted data packets may be connected to a final part of a previous data packet to be arranged, and then, according to an embodiment as illustrated in FIG. 5, an FEC encoding and a packet transmission process using the 3D storage apparatus may be repeatedly performed.

According to an embodiment, the FEC encoding method of the variable-length packet using the 3D storage apparatus has been described, and a FEC decoding method will be herein described.

Figure 6:
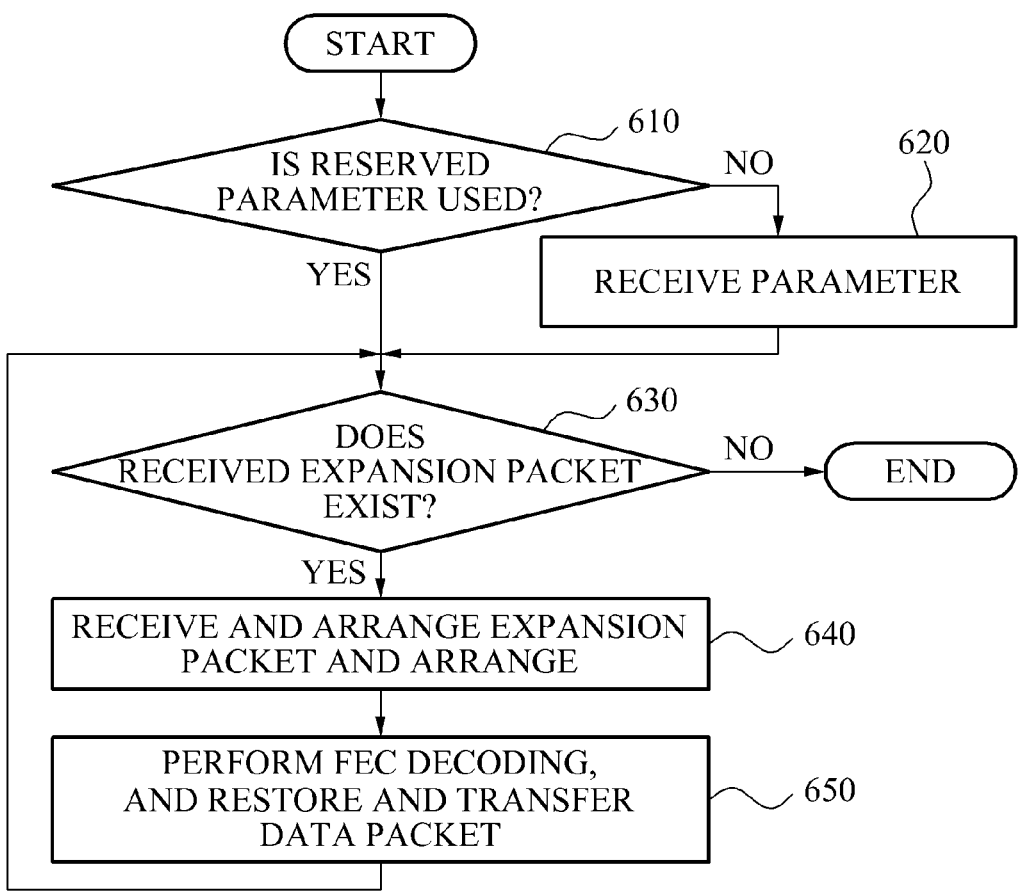
FIG. 6 is a flowchart illustrating an FEC decoding method of a variable-length packet using a 3D storage apparatus according to an embodiment.

FIG. 6 is a flowchart illustrating an FEC decoding method of a variable-length packet using a 3D storage apparatus according to an embodiment.

Referring to FIG. 6, the FEC decoding method may be performed in a reception unit.

In operation 610, the reception unit may determine whether a reserved value is used as a parameter required for the FEC decoding.

In operation 620, when the reserved value is not used, the reception unit may receive and use the parameter transmitted from the transmission unit.

However, when the reserved value is used, operation 620 of receiving the parameter may be omitted.

In operation 630, the reception unit may determine whether an expansion packet transmitted from the transmission unit exists.

In operation 640, when the received expansion packet exists, the reception unit may receive the expansion packet, and then connect the received expansion packet with the 3D storage apparatus depending on an offset of the packet to arrange the connected expansion packets.

In operation 650, the reception unit may perform the FEC decoding using the 3D storage apparatus, restore a data packet, and then transfer the restored data packet to an upper layer. During which the received expansion packet exists, operation 640 of receiving the expansion packet, connecting the expansion packet with the 3D storage apparatus, and arranging the connected expansion packets and operation 650 of performing the FEC decoding, restoring the data packet, and transferring the restored data packet may be repeatedly performed.

In addition, when the expansion packet received in operation 630 does not exist, the reception process may be terminated.

Figure 7:
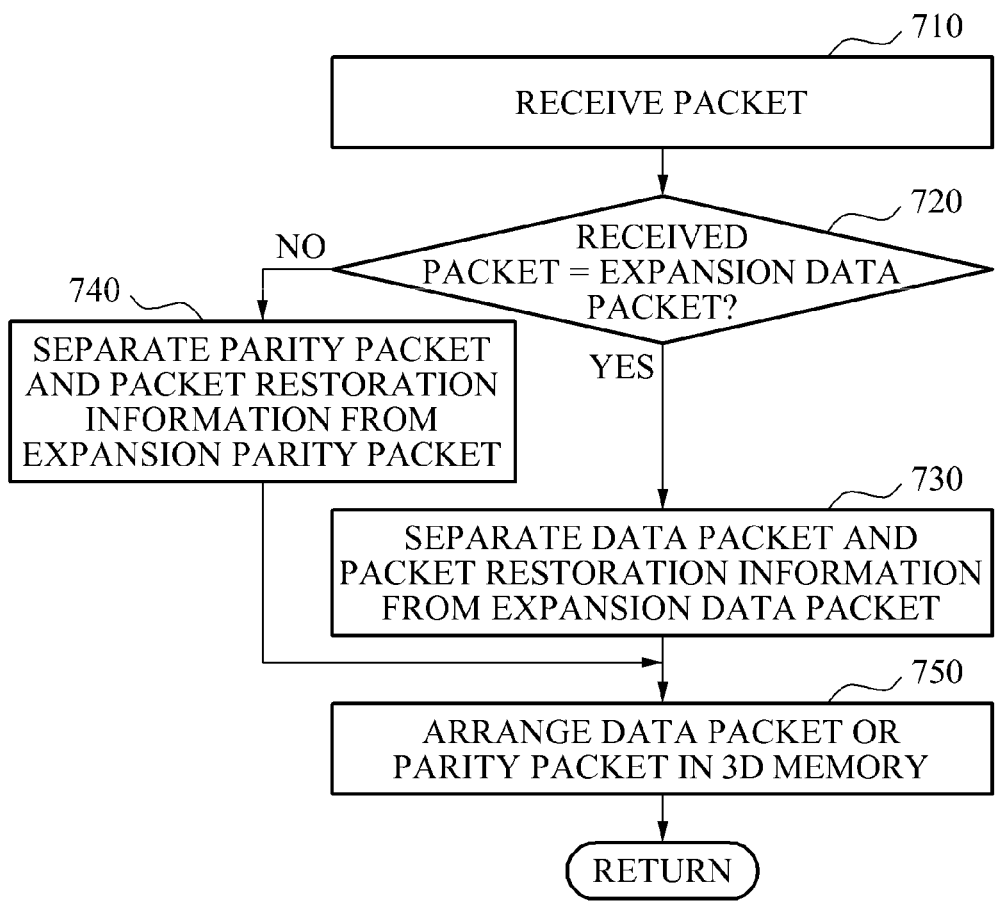
FIG. 7 is a flowchart illustrating an operation of receiving an expansion packet and arranging the received expansion packet in a 3D storage apparatus based on an offset of a data packet, illustrated in FIG. 6.

FIG. 7 is a flowchart illustrating an operation of receiving an expansion packet and arranging the received expansion packet in a 3D storage apparatus based on an offset of a data packet, illustrated in FIG. 6.

Referring to FIG. 7, when the expansion packet transmitted from the transmission unit is received in operation 710, whether the received expansion packet is an expansion data packet or an expansion parity packet may be determined in operation 720.

In operation 730, when the received expansion packet is the expansion data packet, both information for restoration of a data packet included in an expansion packet header and the data packet are separated from the expansion data packet.

In operation 740, when the received expansion packet is the expansion parity packet, both the information for restoration of the data packet and the parity packet are separated from the expansion data packet.

Next, the separated data packet or the separated parity packet may be connected to the 3D storage apparatus of FIG. 9 or a 3D memory to be arranged in operation 750, and then it may return to operation 650 where the FEC decoding is performed using the 3D storage apparatus to restore the data packet, and then the restored data packet is transferred to the upper layer.

In this instance, when the dropped data packet does not exist, an arrangement type of the 3D storage apparatus after each of the data packets or the parity packets is arranged based on an offset may be the same as an arrangement type of the 3D storage apparatus where the transmission unit stores and arranges the input data packet and the parity packet. Specifically, since the reception unit arranges the data packet or the parity packet based on a position of a packet within the 3D storage apparatus, that is, an offset, which is reported by the transmission unit, the arrangement type where the data packet or the parity packet are arranged in each of the transmission unit and the reception unit may be the same. Accordingly, the 3D storage apparatus of the transmission unit and the 3D storage apparatus of the reception unit are illustrated in FIG. 9.

Figure 8:
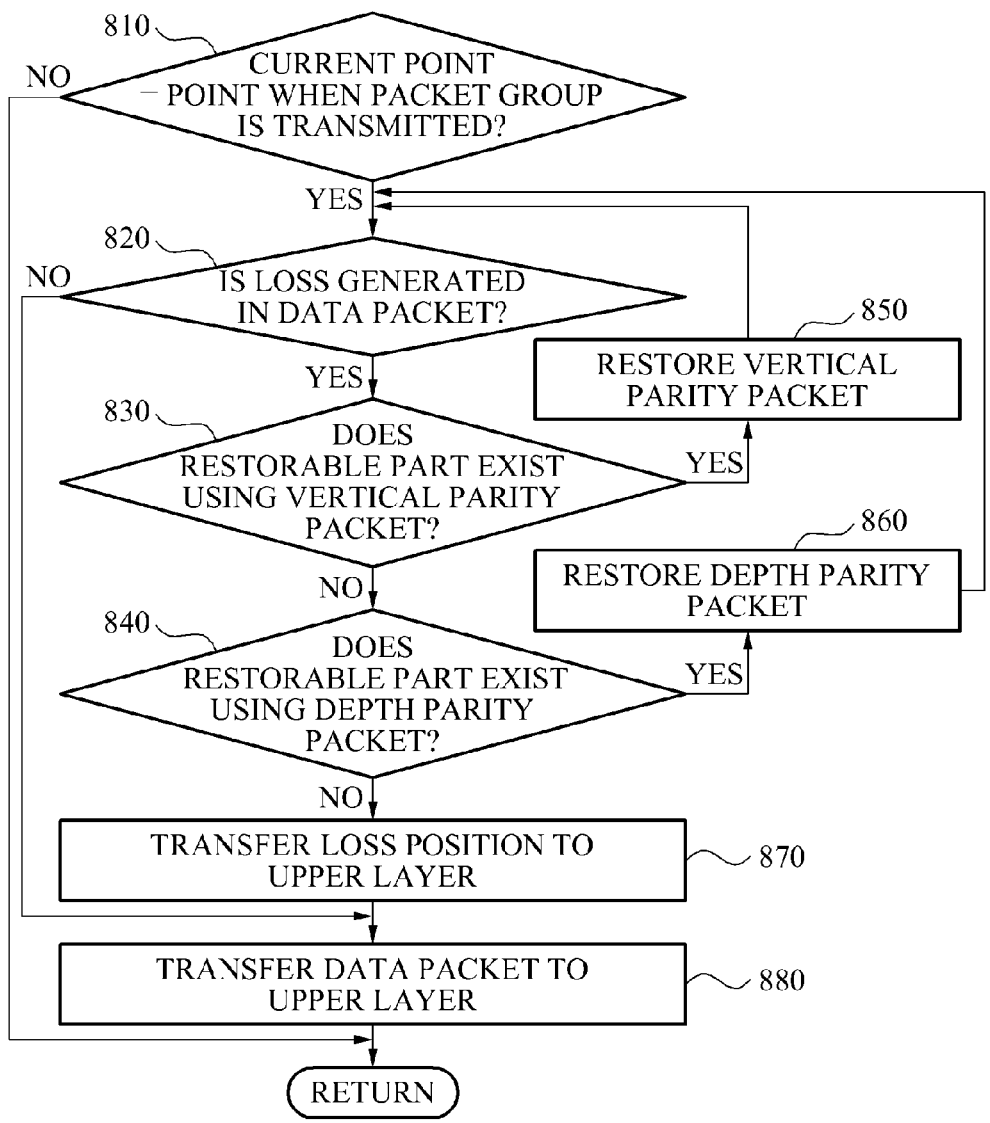
FIG. 8 is a flowchart illustrating an operation of performing an FEC decoding and restoring and transferring a data packet, illustrated in FIG. 6.

FIG. 8 is a flowchart illustrating an operation of performing an FEC decoding and restoring and transferring a data packet, illustrated in FIG. 6.

Referring to FIG. 8, in operation 810, when the separated data packet of FIG. 7 is arranged in the 3D storage apparatus, whether a current point in time is a point in time when a related packet group is transmitted to an upper layer may be determined.

In operation 820, when the current point in time is not the point in time when the related packet group is transmitted to the upper layer, operation 730 or operation 740 may be repeatedly performed, and when the current point in time is the point in time when the related packet group is transmitted, whether a loss of the received data packet exists may be determined.

Here, the upper layer may be a synchronization layer or a decoder layer, and a point in time when the related packet group is transmitted to the upper layer may be a predetermined elapsed time when a final packet within the related packet group arrives at the reception unit, when a packet within a next related packet group arrives at, or when all of packets do not arrive at the reception unit.

Here, the related packet group may be a set of data packets and parity packets corresponding to the data packets.

In operation 860, when a loss of the data packet does not exist in operation 820, the received data packets may be transferred to the upper layer.

In operation 830, when the loss of the data packet exists in operation 820, whether a part of the data packet being restorable using a parity packet of a vertical direction exists may be determined.

Based on the determined result of operation 830, when the restorable part of the data packet exists, the dropped data packet may be restored using the parity packet of the vertical direction in operation 850, and whether the loss of the data packet exists may be re-determined in operation 820.

In operation 880, when the loss of the data packet no longer exist, the received data packet including the restored data packet may be transferred to the upper layer, and in operation 830, when the loss of the data packet still exists, whether the restorable part of the data packet exists may be re-determined.

In operation 850, when the restorable part still exists, the dropped data packet may be restored using the parity packet of the vertical direction.

In operation 840, when the restorable part no longer exists, whether the part being restorable using a parity packet of a depth direction exists may be determined.

Based on the determined result of operation 840, when a part of the data packet being restorable using the parity packet of the depth direction exists, the dropped data packet may be restored using the parity packet of the depth direction in operation 860, and whether the loss of the data packet exists may be determined in operation 820.

In operation 880, when the loss of the data packet no longer exists, the received data packet including the restored data packet may be transferred to the upper layer.

In operation 850, when the loss of the data packet exists, and when the part of the data packet being restorable using the parity packet of the vertical direction exists, the dropped data packet may be restored using the parity packet of the vertical direction.

As described above, since a part of the data packet being restorable using the parity packet of the vertical direction exists after the dropped data packet is restored using the parity packet of the depth direction, a greater number of data packets may be restored in comparison with a case of restoring the dropped data packet only using the parity packet of the vertical direction.

In operation 840, when the part of the data packet being restorable using the parity packet of the vertical direction no longer exist, whether the part of the data packet being restorable using the parity packet of the depth direction exists may be re-determined.

In operation 860, when the part of the data packet being restorable using the parity packet of the depth direction still exists, the dropped data packet may be restored using the parity packet of the depth direction.

In operation 870, when the dropped data packet is not restorable even using the parity packet of the depth direction, a position of the dropped data packet may be transferred to an upper layer, and in operation 880, the data packet may be transferred to the upper layer.

As described above, the reception unit may repeatedly apply the parity packet of the depth direction and the parity packet of the vertical direction in the FEC decoding process using the 3D storage apparatus and the data packet restoration process, thereby improving a restoration function of the dropped data packet. In this instance, an order of applying the parity packet of the vertical direction and an order of applying the parity packet of the depth direction may be switched.

Figure 10:
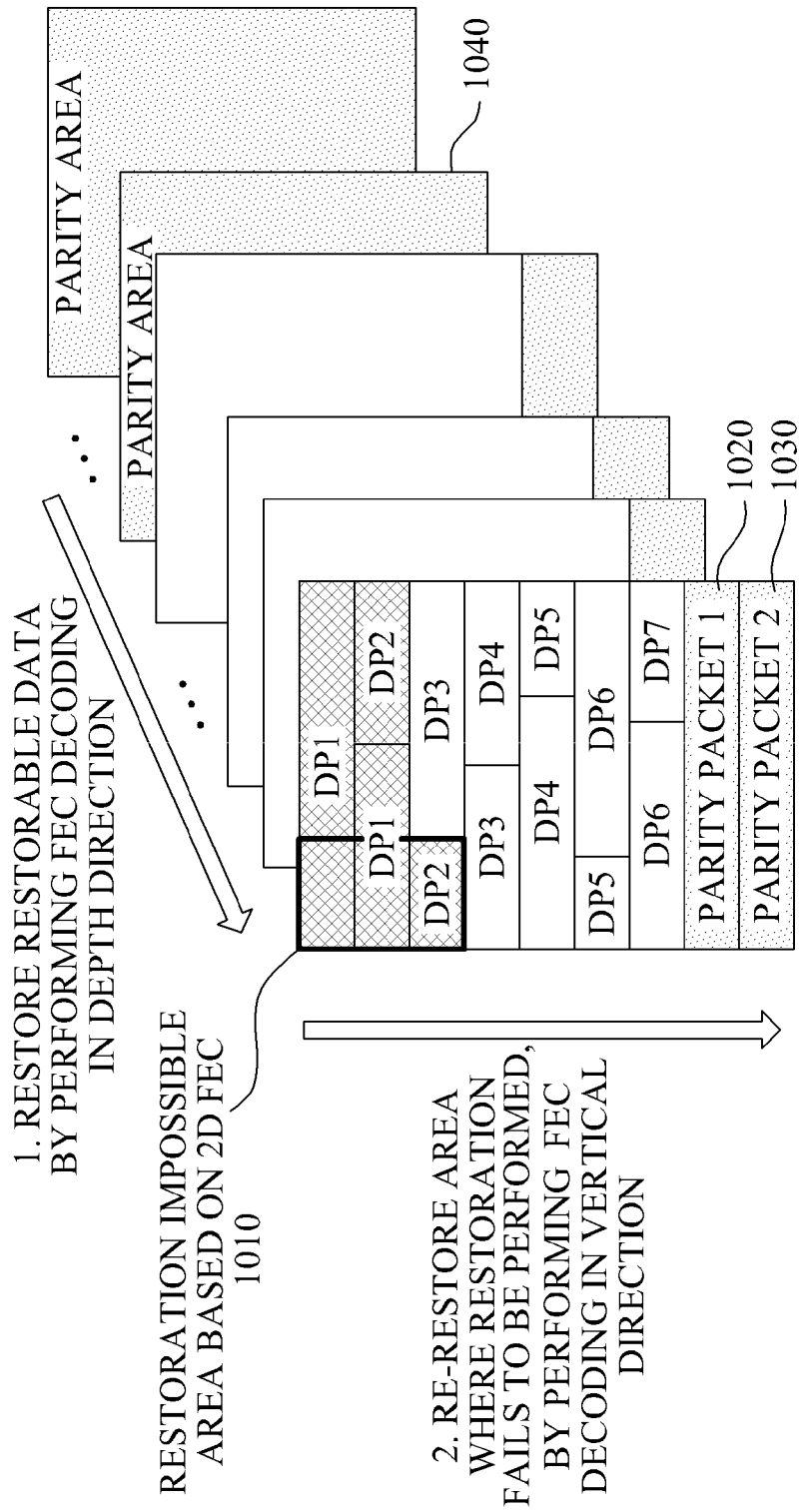
FIG. 10 is a diagram illustrating a process where packets are restored in an FEC decoding method of a variable-length packet using a 3D storage apparatus according to an embodiment.

FIG. 10 is a diagram illustrating a process where packets are restored in an FEC decoding method of a variable-length packet using a 3D storage apparatus according to an embodiment.

Figure 3:
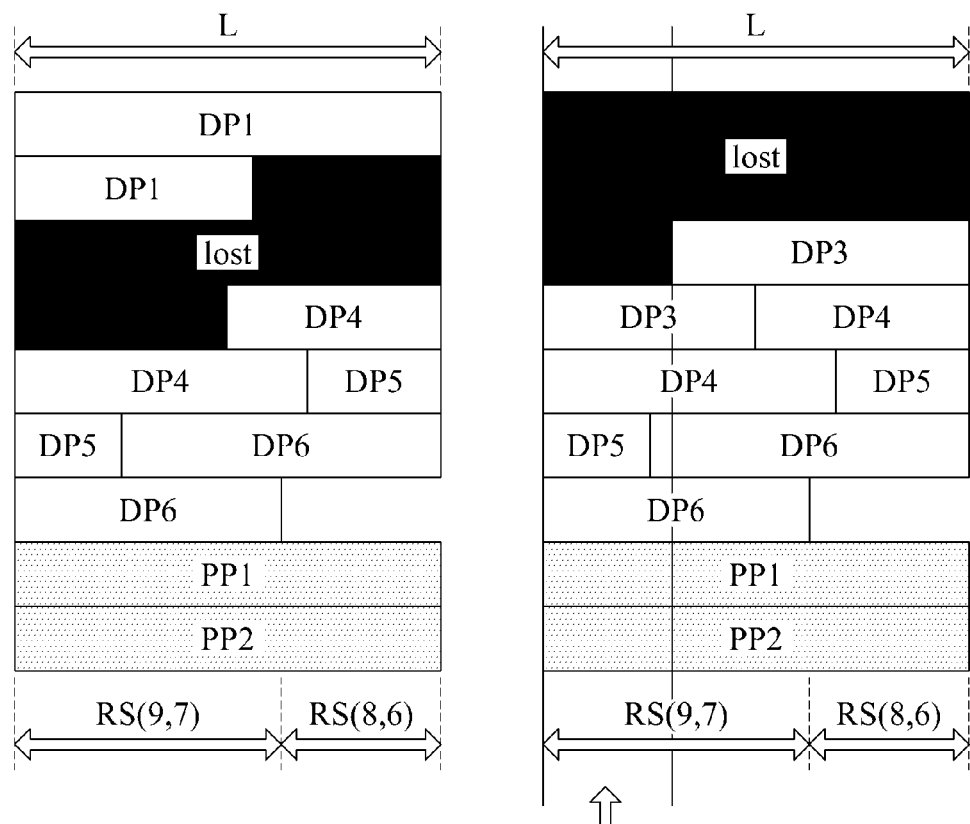
FIG. 3 is a diagram illustrating a restoration process of a received packet in a variable-length packet reception method based on an FEC coding scheme using a conventional 2D storage apparatus.

In an image on a left-hand side of FIG. 3, since RS (9, 7) is used with respect to a restoration of the dropped packet, seven input digits may calculate two parity packets, and the dropped packet may be restored up to two packets as a maxim from nine packets. Here, since each packet uses an RTP protocol having its own serial number, the reception unit may be aware of a position of the dropped packet. In this instance, the dropped packets may be referred to as an erased part. For example, even though a packet 2 (DP2) and a packet 3 (DP3) are dropped and the dropped packets 2 and 3 do not arrive at the reception unit, the dropped packets may be restored using parity packets (PP1 and PP2). This restoration of the dropped packets may be possible in a FEC decoding method using the existing 2D storage apparatus and the FEC decoding method using the 3D storage apparatus according to an embodiment.

In addition, when a digit exceeding two parity packets in the same vertical column position is dropped, the dropped digits may not be restored in the FEC decoding method using the existing 2D storage apparatus. For example, in an image on a right-hand side of FIG. 3, when the packet 1 (DP1) and the packet 2 (DP2) are dropped, since a dropped part is generated in three digits from the horizontal column position illustrated as an arrow, the dropped packets of the dropped part may not be restored in the FEC method using the existing 2D storage apparatus.

In this case, as illustrated in FIG. 10, in the FEC decoding method using the 3D storage apparatus according to an embodiment, when there exists only a single digit being restorable by applying an FEC decoding (1) of the depth direction, from among 3 dropped digit data 1010 that is not restored using the FEC decoding of the vertical direction, a part that fails to be restored may be re-restored by re-applying an FEC decoding (2) of the vertical direction. For example, in the FEC decoding method using the 3D storage apparatus according to an embodiment, at least one digit data among the 3 dropped digit data 1010 may be restored using the parity packet 1040 of the depth direction, and then the dropped remaining digit data may be restored using the parity packets 1020 and 1030 of the vertical direction. Specifically, in the FEC decoding method using the 3D storage apparatus according to an embodiment, the 3 dropped digit data 1010 may be restored by repeatedly applying the FEC decoding (1) of the depth direction and the FEC decoding (2) of the vertical direction to another dropped data area. When a degree of being dropped is not within a restorable range, some of the dropped data may fail to be restored, and a position of the dropped data may be transferred to an upper layer.

In the above example, only a case where 'n' is 9, that is, a case of RS (9, 7) is described, however, when an RS (n, k) code is used, up to the greatest n in an GF 28, that is, up to 28=255 may be applied. Also, when a network state is poor, a number of the parity packets may be increased to increase (n−k).

Also, in the above example, only a case of RS (9, 7) is described, however, the present invention is not limited thereto, and may be applied to other RS codes. Also, the present invention may be applied to a protocol that expresses a serial number of a packet in a header, such as an RTP, and applied to a case where the serial number of the packet is not aware of. In the case where the serial number of the packet, a range where the dropped data packet is restored may be limited within ½ the number of the parity packets.

Also, according to the above embodiments, the data packet and the parity packet may be arranged in the 3D storage apparatus, and the 3D storage apparatus may be a virtual 3D storage apparatus or an actual memory. Here, the 3D storage apparatus storing the inputted data packet may be a virtual 3D storage apparatus designated by an application and the like, or an actual memory separately storing the data packet in a hardware manner.

The methods according to the above-described embodiments may be recorded in non-transitory computer-readable storage media including program instructions to implement various operations embodied by a computer. The media may also include, alone or in combination with the program instructions, data files, data structures, and the like. Examples of non-transitory computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

Although a few embodiments have been shown and described, it would be appreciated by those skilled in the art that changes may be made in these embodiments without departing from the principles and spirit of the disclosure, the scope of which is defined by the claims and their equivalents.

What is claimed is:

1. A Forward Error Correction (FEC) encoding method of a variable length-packet using a three-dimensional (3D) storage apparatus, the FEC encoding method comprising:
   receiving an input data packet to be transmitted when the input data packet exists;
   connecting the input data packet with the 3D storage apparatus and arranging the connected data packet to enable a storage width of the 3D storage apparatus to be a storage length, and to enable a data area height of the 3D storage apparatus to be a storage height; and
   calculating each of parity packets applied in a vertical direction or a depth direction with respect to the arranged data packet by performing an FEC encoding.

2. The FEC encoding method of claim 1, further comprising:
   storing and arranging the calculated parity packet in the vertical direction and the depth direction of the 3D storage apparatus, transmitting an expansion data packet including both information for restoration of the data packet and the data packet, and also transmitting both an expansion parity packet including the information for restoration of the data packet and the parity packet.

3. The FEC encoding method of claim 2, further comprising:
   determining whether a use of a predetermined parameter required for the FEC encoding is reserved; and
   determining the predetermined parameter when the use of the parameter is not reserved based on a determined result, and transmitting the determined parameter.

4. The FEC encoding method of claim 3, wherein the parameter includes at least one of the storage width, the data area height, a number of the parity packets arranged in the vertical direction, and a number of the parity packets arranged in the depth direction.

5. The FEC encoding method of claim 2, further comprising:
designating a set of the data packet and the parity packet corresponding to the data packet, as a packet group.

6. The FEC encoding method of claim 2, wherein the transmitting of the expansion data packet and the expansion parity packet comprises:
accumulating a value of a factor determining whether to transmit the parity packet;
transmitting the expansion data packet including both the information for restoration of the data packet and the data packet;
determining whether a current point in time is a point in time when the parity packet is transmitted;
transmitting the expansion parity packet including both the information for restoration of the data packet and the parity packet when the current point in time is the point in time when the parity packet is transmitted; and
initializing the value of the factor.

7. The FEC encoding method of claim 6, wherein the transmitting of the expansion parity packet including the information for restoration of the data packet and the parity packet comprises:
determining a number of the parity packets to be transmitted;
determining whether a number of the parity packets having been transmitted is greater than or equal to the determined number of the parity packet to be transmitted; and
when the number of the parity packets is greater than or equal to the determined number of the parity packet, initializing the number of the parity packets having been transmitted, otherwise transmitting the expansion parity packet.

8. The FEC encoding method of claim 6, wherein the factor determining whether to transmit the parity packet includes at least one of a size of the input data packet, a number of the input data packets, and time information.

9. The FEC encoding method of claim 6, wherein the point in time corresponds to one of a case where an accumulated size of the input data packet is greater than or equal to a threshold of a predetermined packet group, a case where the accumulated number of the input data packets is greater than or equal to a number of thresholds of the input data packet of the predetermined packet group, and a case where an accumulated elapsed time of the predetermined packet group is greater than or equal to a threshold amount of time.

10. The FEC encoding method of claim 6, wherein the information for restoration of the data packet is included in a header of the expansion data packet or in a header of the expansion parity packet.

11. The FEC encoding method of claim 6, wherein the information for restoration of the data packet includes a packet type and a packet offset.

12. The FEC encoding method of claim 11, wherein the information for restoration of the data packet further includes an offset of each of the data packets when the data packet is the parity packet.

13. The FEC encoding method of claim 7, wherein the number of the parity packets to be transmitted is determined depending on a state of a channel.

14. An FEC decoding method of a variable length-packet using a 3D storage apparatus, the FEC decoding method comprising:
separating a data packet and a parity packet from a received expansion packet when the expansion packet exists;
arranging, in the 3D storage apparatus, the separated data packet depending on an offset of the data packet to enable a storage width of the 3D storage apparatus to be a storage length, and to enable a data area height of the 3D storage apparatus to be a storage height; and
performing an FEC decoding for the data packet using the parity packet applied in a vertical direction or a depth direction with respect to the arranged data packet to thereby restore the data packet, and transmitting the restored data packet to an upper layer.

15. The FEC decoding method of claim 14, further comprising:
determining whether a use of a parameter required for the FEC decoding is reserved; and
receiving the specific parameter from a transmission unit transmitting the data packet when the use of the parameter is not reserved.

16. The FEC decoding method of claim 14, wherein the separating comprises:
determining whether the expansion packet is an expansion data packet including the data packet or an expansion parity packet including the parity packet;
separating the data packet and information for restoration of the data packet from each other when the expansion packet is the expansion data packet including the data packet; and
separating the parity packet and the information for restoration of the data packet from each other when the expansion packet is the expansion parity packet including the parity packet.

17. The FEC decoding method of claim 14, wherein the performing of the FEC decoding comprises:
determining whether a current point in time is a point in time when a packet group is transmitted to the upper layer; and
transmitting the separated data packet to the upper layer when the current point in time is the point in time when the packet group is transmitted to the upper layer.

18. The FEC decoding method of claim 17, wherein the point in time is one of a point in time when a final packet of the packet group is transmitted, a point in time when a packet of a next packet group arrives, and a point in time when a specific amount of time elapses.

19. The FEC decoding method of claim 14, wherein the performing of the FEC decoding comprises:
determining whether the data packet is dropped;
restoring the dropped data packet using the parity packet applied in the vertical direction or the parity packet applied in the depth direction when the data packet is dropped; and
transmitting the received data packet to the upper layer when the data packet is not dropped.

20. The FEC decoding method of claim 19, wherein the performing of the FEC decoding further comprises:
transmitting a dropped position of the data packet to the upper layer when a part of the data packet failing to be restored exists, or when a part of the data packet to be restored using the parity packet does not exist.

* * * * *